United States Patent [19]

Kelly

[11] 3,710,374

[45] Jan. 9, 1973

[54] DUAL-SLOPE AND ANALOG-TO-DIGITAL CONVERTER WHEREIN TWO ANALOG INPUT SIGNALS ARE SELECTIVELY INTEGRATED WITH RESPECT TO TIME

[75] Inventor: Austin T. Kelly, Morristown, N.J.

[73] Assignee: Wester Instruments, Inc., Newark, N.J.

[22] Filed: Aug. 17, 1970

[21] Appl. No.: 64,275

Related U.S. Application Data

[63] Continuation-in-part of Ser. No. 19,605, March 16, 1970, abandoned.

[52] U.S. Cl.........340/347 NT, 340/347 AD, 235/183

[51] Int. Cl...............................................H03k 13/20

[58] Field of Search.........340/347; 235/183, 150.51; 328/127, 151

*Primary Examiner*—Maynard R. Wilbur

*Assistant Examiner*—Charles D. Miller

*Attorney*—William R. Sherman, Stewart F. Moore, Jerry M. Presson, Leonard R. Fellen and Roylance, Abrams, Kruger, Berdo & Kaul

[57] ABSTRACT

An electrical integrating circuit arrangement is disclosed which is especially suitable for use in combination with timing means in dual-slope analog-to-digital converters because it operates with time controlled closure of a single, low-impedance switching device of the single-pole, single-throw type to effect selective time integrations of two D.C. input signals; an analog signal and an oppositely directed reference current. The integrating arrangement comprises an operational amplifier having inverting and non-inverting inputs and feedback to the inverting input through a capacitor. The analog signal source may be permanently connected to the non-inverting input whereas the second input signal is similarly connected to the inverting input through a resistance. The switching device is closed to connect the second input signal end of the resistance to a source of potential. Timed closure of the switching device by the timing means causes the integrating arrangement to generate two successive voltage ramps having slopes which are respective functions of the two signals exclusive of one another. The instant combination may be utilized to advantage in the digitalization of bipolar analog signals.

13 Claims, 6 Drawing Figures

INVENTOR.
Austin T. Kelly
BY

ATTORNEY

DUAL-SLOPE AND ANALOG-TO-DIGITAL CONVERTER WHEREIN TWO ANALOG INPUT SIGNALS ARE SELECTIVELY INTEGRATED WITH RESPECT TO TIME

This application is a continuation-in-part of U. S. application, Ser. No. 19,605, filed Mar. 16, 1970 now abandoned.

This invention relates to analog-to-digital converters of the dual-slope type and more particularly, to an electrical integrating circuit arrangement which finds special utility in low-cost digital voltmeters of the specified type.

In one type of dual-slope analog-to-digital converter a relatively slow time-varying or D.C. signal, often referred to as the "analog signal," is integrated by an electrical signal integrating means for a fixed time interval and then replaced by an oppositely-directed D.C. current of predetermined, invariant magnitude, and often referred to as the "reference signal."

For certain converter applications, it is preferred that the time integrations be performed in this manner, that is, either upon the analog signal or the reference current so that the potentials developed across the integrating means during intervals of reference current integration are representable as linear ramps having slopes which are not affected by the analog signal during such intervals.

To achieve exclusivity in the successive time integrations of the analog and reference signals, analog-to-digital converters of the described type generally employ a minimum of two input switches; one to selectively connect the analog signal source to the integrating means input and the other to selectively connect a reference signal source of appropriate polarity to that input.

It is known in the art to employ shunt or series switches or combinations thereof for variously switching the input of the integrating means to achieve exclusivity between the time integrations of the analog and reference signals. Switches connected in shunt or parallel with the analog signal source, however, characteristically reduce the input impedance of the converter which is disadvantageous because it is usually preferred that this impedance be as high as possible to avoid attenuating the transmission of the analog signal from the analog source. Switches which series connect the analog source to the integrating means normally have one terminal floating at the potential of the analog source and another terminal floating at the potential of the integrating means input. Although these switches provide the converter with the generally preferred high input impedance, since certain of the switch terminals float at random potential levels, switch opening or closure may inject error-causing transient signals into the converter input or into the analog signal source. Because of the random nature of these transients, it is very difficult to provide appropriate compensation therefor. Finally, converters requiring a plurality of switches for exclusively feeding the analog and reference signals to the integrating means typically require the various switches to operate in predetermined, precisely synchronized sequence during a conversion cycle. While precise synchronization of switch operation may be achieved through the use of electronic logic and control circuitry, resort to such expedients increases the complexity and cost of the converter and tends to reduce its operating reliability.

It is an object of this invention to provide a new and improved electrical integrating means for performing the exclusive time integrations of two D.C. signals through operation of a single switching device of the single-pole, single-throw type.

Another object of this invention is an analog-to-time conversion system employing a highly simplified signal integrating arrangement operated in a manner to effect timed integrations of an analog signal and a reference signal in a mutually exclusive fashion with the sources of the analog and reference signals permanently connected to the integrating circuit input during both signal integrations.

Yet another object of this invention is an analog-to-digital conversion system especially suitable for utilization in low-cost integrating digital voltmeters, wherein the time integrations of two signals derived from different D.C. signal sources are made mutually exclusive through closure of a single switching device of the single-pole, single-throw type.

Still another object of this invention is an integrating circuit arrangement particularly suitable for use in analog-to-digital converters of the dual-slope type; the arrangement providing a high input impedance, substantial elimination of transient effects caused by selectively switching the integrating circuit input between sources of analog and reference signals, and elimination of any need for synchronizing switching between the signal sources.

Yet an additional object is to provide a highly simplified analog-to-digital conversion system which may be readily transformed from one for converting a monopolar to one for converting a bipolar analog input into digital form.

According to this invention, there is provided an electrical integrating means which is especially suitable for combination with appropriate timing means to provide integrating types of voltage-to-time converters because the integrating means requires time controlled operation of only a single low impedance switching device of the single-pole, single-throw type to effect the selective time integrations of two electrical input signals. The integrating means may comprise an operational amplifier having input inverting and noninverting inputs with negative feedback through a capacitor, the amplifier being connected in a noninverting mode with uninterrupted connections to the sources of both input signals during a conversion cycle. The electrical circuit between one input signal and the inverting input of the amplifier includes an impedance which is selectively connected to a source of electrical potential upon closure of the switching device, whereby the integrating means is caused to generate two oppositely directed voltage ramps having respective slopes relative to some datum level which are direct functions of each input signal independently of the other.

In accordance with one illustrative embodiment of this invention, an integrating circuit is disclosed which finds particular utility in low-cost, integrating types of digital voltmeters. The circuit includes a conventional operational amplifier having high gain, signal inverting and signal noninverting inputs and an output. An analog signal source is permanently connected to the noninverting input at least for the interval of one conversion cycle defined by successive first and second time intervals and no provision is made to physically divert or switch the analog signal source from this input during these time intervals. A capacitor in a feedback circuit coupling the amplifier output to the signal inverting input charges at a rate which is proportional to the magnitude of an analog current derived from the analog signal source. An impedance, specifically a resistor, joins the inverting input of the amplifier to a source of reference current at a junction, and upon closure of a single, low-impedance switch characterizable as being of a single-pole, single-throw type, the junction is connected to a potential source. With a high gain dual input amplifier in the integrating circuit the voltage at the amplifier inverting input and hence at the corresponding end of the resistor follows the voltage of the analog signal in respect to both magnitude and polarity.

During a typical first time interval of the conversion cycle, the switch closes to connect the junction end of the impedance and the reference current source to the potential source, and the capacitor is charged by current flowing through the capacitor and the impedance at a rate proportional to the magnitude of the analog voltage at the noninverting input of the amplifier divided by the resistance value of the impedance. During the second time interval, the switch is opened, opening the previously closed circuit for analog current flow through the capacitor and impedance, and reference current is caused to flow through the resistor in a direction opposite that of the previously flowing analog current to discharge the capacitor. Accordingly, during this interval, the charge on the capacitor is reduced at a rate which is dependent upon the reference signal magnitude but independent of the analog signal magnitude.

The potential source to which one side of the switch is connected may be accorded a voltage level which is referenced to the full scale magnitude of an analog signal for which the voltmeter is designed or the voltage level may be another analog voltage in which case the voltmeter may be operated in a differential mode. Moreover, by according to this potential source a voltage greater than full scale a particularly simplified version of a bipolar dual-slope digital voltmeter is realizable.

For a better understanding of the present invention, together with other and further objects thereof, reference may be had to the following description taken in connection with the accompanying drawings, the scope of the invention being pointed out in the appended claims.

Referring to the drawings.

Figure 1:
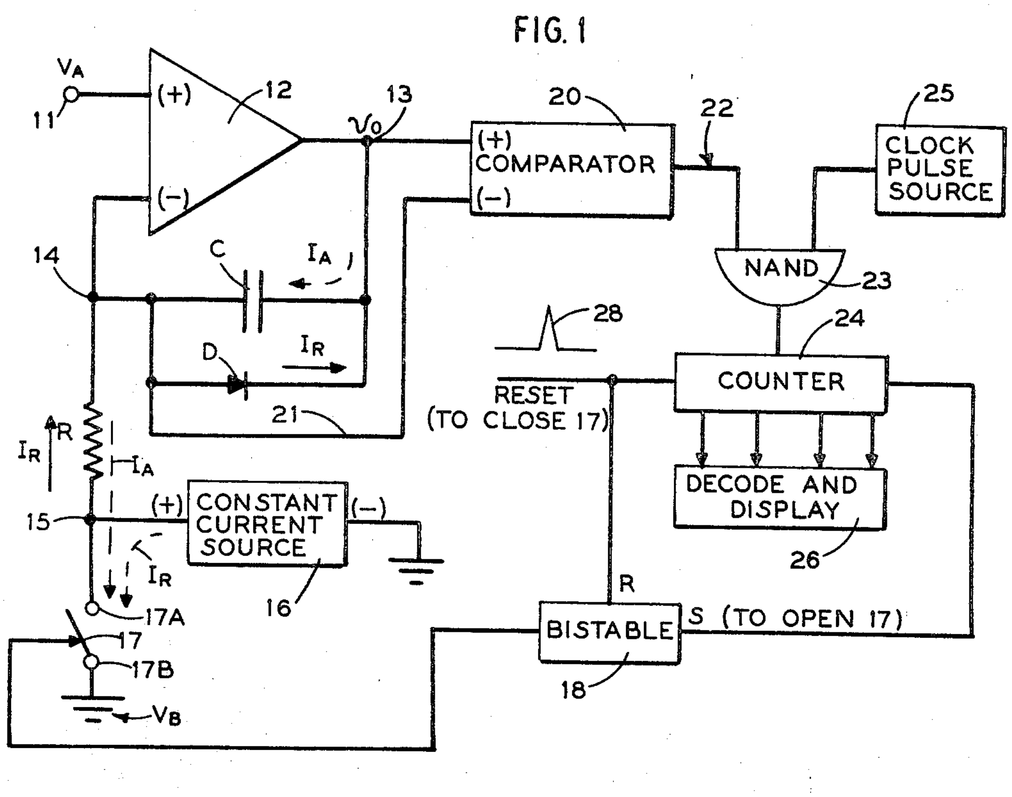
FIG. 1 illustrates partially in block and partially in schematic form an embodiment of an electrical signal integrating means constructed in accordance with the principles of this invention, as utilized in a dual-slope integrating type of digital voltmeter.

In FIG. 1 there is illustrated one embodiment of a low-cost digital voltmeter of the dual-slope integrating type which utilizes the integrating means of the instant invention.

The analog signal voltage $V_A$ is a typically slow time-varying or DC voltage derived from some suitable voltage source depicted simply as a terminal 11. The terminal 11 is connected to the noninverting input terminal of an operational amplifier having a current gain of at least 100 and typically much higher and a dual or differential input with high impedance therebetween. Amplifiers of this type are commonly known as "differential amplifiers." Following standard sign conventions, the noninverting input terminal is designated (+) whereas the inverting input terminal is designated (−). A current limiting resistor of relatively small resistance value, not shown, may be coupled between the terminal 11 and the noninverting terminal to prevent overloading of the amplifier by excessive input voltage.

It should be noted that the electrical circuit between the terminal 11 and the amplifier 12 does not incorporate any type of switching device but rather the connection normally remains uninterrupted during the time interval required for at least one conversion cycle. Thus, the aforementioned disadvantages which may result from employing series or shunt electrical switches between the analog source and the amplifier input are obviated.

Output terminal 13 of amplifier 12 is coupled to the inverting input terminal 14 of the amplifier by means of a feedback circuit which includes a capacitor C. The amplifier 12 and the capacitor C constitute a linear integrator which produces a voltage $v_O$ at output terminal 13. Shunting the capacitor C is a voltage-clamping diode D poled as illustrated for assumed positive values of $V_A$ and in a reverse direction for negative values of $V_A$. The voltage at terminal 14 must be linearly related to the analog voltage $V_A$ and since the D.C. voltages at the inverting and noninverting input terminals of high gain operational amplifiers tend to track one another exactly both in magnitude and polarity with any voltage differences therebetween being on the order of millivolts, the voltage of the terminal 14 will be assumed hereafter to be equal to $V_A$. Moreover, if necessary, any voltage offset at the terminal 14 caused by the amplifier 12 may be reduced to zero by appropriate adjustment of offset compensating circuitry which is typically embodied in such amplifiers for this purpose.

The departure and return of the voltage $v_O$ from and to threshold is effected by the integrating circuit operating under the control of additional apparatus connected to the terminal 14. This additional apparatus includes a resistor R joining the terminal 14 to a junction 15 to which is connected one side of a conventional reference current source, designated generally by the numeral 16.

The other side of the source 16 is illustrated as connected to ground potential and a switch 17 is depicted as a single-pole, single-throw switch having a contact 17A connected to the junction 15 and another contact 17B connected to a source of constant or fixed potential, designated $V_B$. The state of the switch 17 is controlled by two discrete voltage outputs of a bistable or flip-flop 18 having set and reset states and corresponding inputs designated S and R, respectively; the bistable causing contact 17A closure when in a reset state and contact 17A opening when in a set state.

The switch 17 may, and typically does, take other equivalent forms, such as that of a single, solid-state bipolar transistor connected in a noninverting mode with an emitter junction connected to the junction 15, a collector junction connected to the source $V_B$, and a base junction coupled to the output of the bistable 18. A single, low resistance field-effect transistor switch is also suitable. In this embodiment of the invention, the source $V_B$ is taken as ground (zero volts, zero impedance) and to provide a low-impedance path for current flow through the closed or enabled switch, the resistance of the closed switch added to the resistance of the potential source $V_B$ connected to the corresponding switch contact, terminal or junction (as appropriate to the particular switch implementation) must be considerably lower than the resistance value of the resistor R.

Assuming that a negligible voltage drop is developed across the switch 17 when closed, as indicated by the dashed lines, and with $V_B$ made equal to zero volts, the capacitor C charges at a rate proportional to an analog current $I_A$ of magnitude equal to $V_A/R$. Thus during switch closures, the total current flow through the switch 17, as indicated by the dashed line arrows, is equal to the sum magnitude of $I_R + I_A$.

When the switch 17 is opened, although the terminal 14 remains at the assumed level of $V_A$, the reference current source 16 by virtue of its polarity and magnitude injects a reference current $I_R$ through the resistor R in a direction indicated by the solid line arrows to withdraw electrical charge from the capacitor C at a rate proportional to the magnitude of $I_R$ but independent of the voltage $V_A$. The analog current $I_A$ does not flow to oppose the reference current $I_R$ during this time interval because the potential at the terminal 14 end of the resistor R remains equal to $V_A$ whereas the potential at the junction 15 end of the resistor rises to $(V_A + I_RR)$, thereby effecting cancellation of the voltages of assumed magnitude $V_A$ at opposite ends of the resistor R. Thus, it will be evident that during intervals when the contact 17A is opened the voltage $V_A$ has no effect on the discharge circuit and consequently the capacitor C has charge withdrawn from it at a rate proportional to the magnitude of $I_R$ dependent of the voltage $V_A$.

The discharging of the capacitor C drives the voltage $v_O$ to a quiescent level sufficiently negative to overcome the reverse biasing accorded the diode D prior to $v_O$ attaining that level. When this occurs, the diode D is forward biased into conduction whereupon reference current $I_R$ flowing through the conducting diode in the direction of the solid line arrow clamps the voltage $v_O$ at a quiescent voltage level equal to $(V_A - V_D)$, FIG. 2A; where the quantity $V_D$ is the forward voltage drop across the diode D. Assuming $V_D$ to be on the order of 0.6 volt, under quiescent conditions the voltage $v_O$ is clamped at $(V_A - 0.6)$ volts relative to ground potential. While forwardly conducting, the diode D prevents the amplifier 12 from being driven into a saturated or nonlinear mode by reference current $I_R$ applied thereto prior to the initiation of a conversion cycle.

A conventional voltage comparator or threshold level detector 20 has one input terminal designated (+), coupled to the terminal 13 and a second input terminal, designated (−), connected by a lead 21 to the terminal 14. Hence, the comparator (+) terminal floats at the potential of the terminal 14. In order to ensure negligible current flow into and out of the comparator input terminals, and particularly the comparator (−) terminal, the comparator 20 should be selected or designed to provide a relatively high input impedance. With input terminals connected across the different plates of the capacitor C, the comparator 20 responds by changing state to the potential differentials developed across the capacitor C.

Under quiescent conditions, the potential at the comparator (+) terminal is clamped at a level equal to $(V_A - V_D)$ whereas the comparator (−) terminal floats at the potential of $V_A$. The comparator 20 remains in quiescence until the bistable 18 is reset and closes the switch 17 causing the diode D to be reverse biased out of conduction by the positive ramping voltage $v_O$ at the terminal 14. The voltage $v_O$, FIG. 2A, continues to ramp positive and in the process attains and crosses a threshold which may be considered as a variable level threshold defined by a condition of magnitude equality between $v_O$ and $V_A$. When threshold is crossed, the potential at the comparator (+) terminal will be more positive than the potential at the comparator (−) terminal and causes the comparator 20 to reverse its state.

Figure 2:
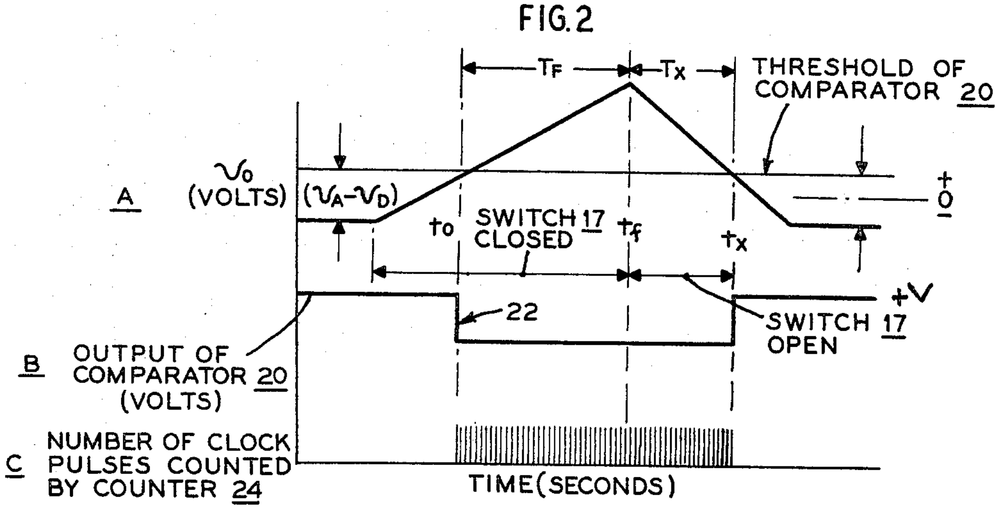
FIG. 2A illustrates a typical voltage waveform produced at the integrating means output when the integrating means operates in enviornment of the illustrated voltmeter.
FIG. 2B illustrates the voltage output of a voltage comparison circuit coupled to monitor potentials produced across the integrating means.
FIG. 2C illustrates representative numbers of clock pulses counted to provide a representation in the time domain of the analog voltage magnitude.

When the comparator 20 switches from its quiescent state the voltage output of the comparator, depicted in FIG. 2B as waveform 22, drops from a quiescent level of +V volts to a negative level of −V volts which is sufficiently negative to enable a NAND gate 23; the gate 23 having been previously maintained disabled during quiescence by the positive voltage +V applied to its input. The time at which this negative-going step transition occurs in the waveform 22 is designated as the time $t_o$ and represents the beginning of a fixed time interval $T_F$, FIG. 2A, during which the time integration of the analog current $I_A$ is clocked by a pulse counter 24 receiving clock pulses, via the enabled gate 23 from a suitable source of regularly recurring clock pulses 25. Clock pulse counting by the counter 24 during this and a subsequent time interval $T_X$ is illustrated by FIG. 2C.

The gate 23 remains enabled until the comparator 20 is triggered to the quiescent state by the voltage $v_O$ returning to and recrossing threshold and thereby causing a potential to appear at the comparator (+) terminal which is more negative than the potential at the comparator (−) terminal. The time at which this occurs is designated $t_x$ in FIG. 2A and by virtue of the gate 23 being disabled, the counter 24 stops counting clock pulses at threshold crossing. Subsequent to the time $t_x$, the pulse count of the now-stabilized counter 24 may be decoded and displayed by operation of conventional decoding and display circuitry, referred to generally by the numeral 26, FIG. 1, to provide a visual, representative digital display of the magnitude of the voltage $V_A$. This display persists until a subsequent conversion cycle is initiated.

The bistable 18 set input S is coupled to a selected counting stage of the counter 24 and receives a pulse from this stage which triggers the bistable into its set state to initiate the discharge of the capacitor C when the counter counts a predetermined number of clock pulses. The bistable triggering pulse may be a voltage pulse generated by the selected counter stage when the counter receives a full scale count and overflows upon recycling. In FIG. 2B, $t_f$ designates the corresponding instant of time during the conversion cycle.

The bistable 18 and counter 24 are coincidentally reset by application of a reset pulse 28 thereto, this pulse being derived from any suitable signal source and applied to the bistable and counter when it is desired to initiate a conversion cycle. In the illustrated embodiment, a reset pulse is applied to reset the counter to some predetermined starting count, such as full-house zeros, and to trigger the bistable 18 into its reset state.

DESCRIPTION OF OPERATION OF FIG. 1 EMBODIMENT

At quiescence, the more positive voltage $V_A$ at the terminal 14 holds the comparator 20 in a state of quiescence whereupon the positive comparator output +V, FIG. 2B, maintains the gate 23 disabled. The switch 17 is held open by the voltage output of the bistable 18 which is in a set state at quiescence and the display 26 provides a persistent digital display of the magnitude of the voltage $V_A$ received by the integrating means during a previous conversion cycle.

Initiation of a conversion cycle is effected by applying the reset pulse 28 to the bistable 18 and to the counter 24 causing the bistable to reset and close the switch 17 and the counter 24 to reset to some predetermined starting count.

Upon closure of the switch 17, the capacitor C is charged by flow of analog current $I_A$ between the terminals 13 and 14, the potential at the terminal 13 ramping from a clamped level of $(V_A-V_D)$ in a positive sense until the floating threshold $(v_0=V_A)$ of the comparator 20 is attained and crossed, FIG. 2A. This occurs at time $t_o$ and assuming the integration to be linear, the slope of the first ramping voltage waveform departing from the plane of threshold is directly proportional to the magnitude of the voltage $V_A$. At time $t_o$ and in response to the now slightly more positive voltage at the (+) input terminal of the comparator 20, the comparator switches out of quiescence, produces a negative step in its output 22, FIG. 2B, and thereby enables the gate 23 to pass clock pulses from the source 25 to the counter 24. The counter 24 proceeds to count clock pulses until a fixed number of pulses have been counted whereupon a selected stage of the counter applies a pulse to the S input of the bistable 18 which triggers the bistable into the set state. The bistable 18 reverts to the set state at time $t_f$, FIG. 2A, and opens the switch 17 at that time.

Thus, the switch 17 is closed for a fixed time interval $T_F$, FIG. 2A, after the first ramp crosses threshold and the voltage $v_O$ generated in this interval may be defined by the following equations as:

$$v_0=V_A+\frac{1}{C}\int_{t_o}^{t_f}\frac{V_A-V_B}{R}dt \qquad (1)$$

Under the previously assumed conditions that $V_B = 0$ and with the switch 17 assumed to offer a negligible resistance to current flow equation (1) reduces to:

$$v_0=V_A+\frac{1}{C}\int_{t_o}^{t_f}\frac{V_A}{R}dt=V_A+\frac{1}{C}\left[\frac{V_A}{R}(t_f-t_o)\right]$$

Since $(t_f-t_o) = T_F$, it follows that:

$$v_O = V_A + 1/C\,[(V_AT_F)/R] \qquad (2)$$

For reasons discussed hereinabove, the opening of the switch 17 causes only the reference current $I_R$ to flow through the resistor $R$ and withdraw the charge accumulated by the capacitor $C$ at a constant rate during the interval $T_X$, FIG. 2A. Thus during this second time interval of the conversion cycle beginning with time $t_f$, the waveform of the voltage $v_O$ is characterizable as a second ramp directed back toward threshold with a slope directly proportional to the magnitude of the current $I_R$. The counter 24 continues to receive and count clock pulses until this second ramp recrosses threshold at a time $t_x$, FIG. 2A. At time $t_x$ the comparator 20 acting in response to a corresponding reversal in the voltage polarity between the comparator (+) and (−) terminals reverts to its quiescent state. Upon reverting to this state the comparator disables the gate 23 with a step positive voltage output, FIG. 2B, and thereby stops pulse counting by the counter 24. The voltage $v_O$ generated during the time interval from $t_f$ to $t_x$ and designated $T_X$ in FIG. 2B, may be defined by the following equations as:

$$v_0=V_A+\frac{1}{C}\int_{t_f}^{t_x}I_R dt=V_A+\frac{1}{C}[I_R(t_x-t_f)]$$

Since $(t_x-t_f) = T_X$, it follows that:

$$v_O = V_A + 1/C\,[I_R\,T_X] \qquad (3)$$

Equations (2) and (3) are continuous functions of the dependent variable $v_O$ and therefore may be equated, yielding:

$$T_X/T_F = V_A/I_RR \text{ or,} \qquad (4)$$

$$T_X = V_AT_F/I_RR \qquad (5)$$

Since the quantities of $T_F$, $I_R$ and $R$ are constants in equations (4) and (5) during conversion, it will be apparent that the time interval $T_X$ is directly proportional to the magnitude of the analog voltage $V_A$. By timing the interval $T_X$ with clock pulses in the manner described above, the magnitude of the analog voltage $V_A$ is converted into the time domain and then into a digital representation of the voltage magnitude.

By providing a predetermined voltage magnitude to $V_B$ which is a fraction of the full-scale magnitude of the analog input $V_A$ for which the converter is designed, and hereinafter designated $V_{A(FS)}$, it is possible to increase the signal-to-noise ratio of the system to advantage by increasing the magnitude of the analog current flowing through the resistor $R$ and the capacitor $C$. The relationship between the absolute magnitudes of $V_B$ and $V_{A(FS)}$, that is, without regard to the polarity of either quantity, then may be expressed generally by the equation $V_B = NV_{A(FS)}$; where $N$ is a constant of numerical value less than unity, for example, 1/10, 1/5 or 1/4 corresponding to pulse counts of 100, 200 or 250, respectively, in the illustrative four decade counter 24.

In the aforedescribed embodiment of FIG. 1 with $V_B$ assumed equal to zero, upon closure of the switch 17, the current flowing in resistor R has no component attributable to $V_B$ and the counter 24 registers only the digital value of $V_A$ at the end of each conversion cycle. Moreover, with $V_B$ of zero value since the quantity $V_{A(FS)}$ in the equation $V_B = NV_{A(FS)}$ is not zero, it follows that $N$ is equal to zero.

If $V_B$ has a magnitude other than zero volts, it will appear as an analog input signal to the integrator during those time intervals when the switch 17 is closed. In certain instances it may be preferred that the digital representation provided by the converter be solely that of the voltage $V_A$ magnitude, and not $V_A$ combined with an offset voltage such as $V_B$. In other instances it may be desired to provide a digital representation of the difference between $V_A$ and $V_B$ which representation is obtainable directly from the counter 24, as will be apparent. In the former instances compensation for that component of current in resistor R attributable to $V_B$ may be effected by presetting the counter 24 to register an appropriate compensating count upon receiving the reset pulse 28. To illustrate, for positive values of $V_A$ and $V_B$ and with $V_B$ a fraction of $V_{A(FS)}$, the net current flow in resistor $R$ will be reduced by an amount $V_B/R$, the capacitor $C$ will charge at the corresponding slower rate and at the end of the $T_X$ interval, the counter 24 will register a count value equal to $(V_A - V_B)$. By initially setting the counter 24 to a count less than zero (0000) by a count value equal to $V_B$, the counter in counting up from this initial count through zero allows the capacitor $C$ an additional, equal amount of time to charge to a higher level in the interval $T_F$ which corresponds to the time integral of $V_A$ solus. Conversely, if $V_A$ is positive and $V_B$ negative, the net current flow is increased by the amount $V_B/R$ and, hence compensation for this additional current may be effected by presetting the counter 24 to a greater count value equivalent to the count value of $V_B$.

Similarly, if $V_A$ and $V_B$ are both negative, the counter 24 may be initially set to a count less than zero by an amount equal to the count value of $V_B$, whereas a negative $V_A$ and a positive $V_B$ require the counter to be preset to a greater than zero count equal to the count value of $V_B$. A negative $V_A$ requires a polarity reversal from that depicted by FIG. 1 of the current source 16 and the diode D and a reversal of the integrator connections to the (+) and (−) input terminals of the comparator 20.

With $V_B$ other than ground or chassis potential, the converter may be calibrated to account for voltages generated by current flow into the source of voltage $V_B$, or alternately, the source may be selected or designed to have an internal resistance which is negligible compared to the resistance of resistor $R$.

Although the conversion of monopolar analog inputs is described above with a $V_B$ of zero volts, the unidirectional counter 24 may be utilized in the conversion of a bipolar input voltage $V_A$ by providing an additional current source (not shown) similar, but of reverse polarity, to that of the source 16 and suitable logic circuitry (not shown) responsive to a change in $V_A$ polarity to connect the appropriate one of the two current sources to the terminal 15. Additional circuitry is also required to automatically reverse the polarity of the diode D and the connections to the comparator 20 input terminals coincident with reversals of $V_A$ polarity.

DESCRIPTION OF FIG. 3 EMBODIMENT

Figure 3:
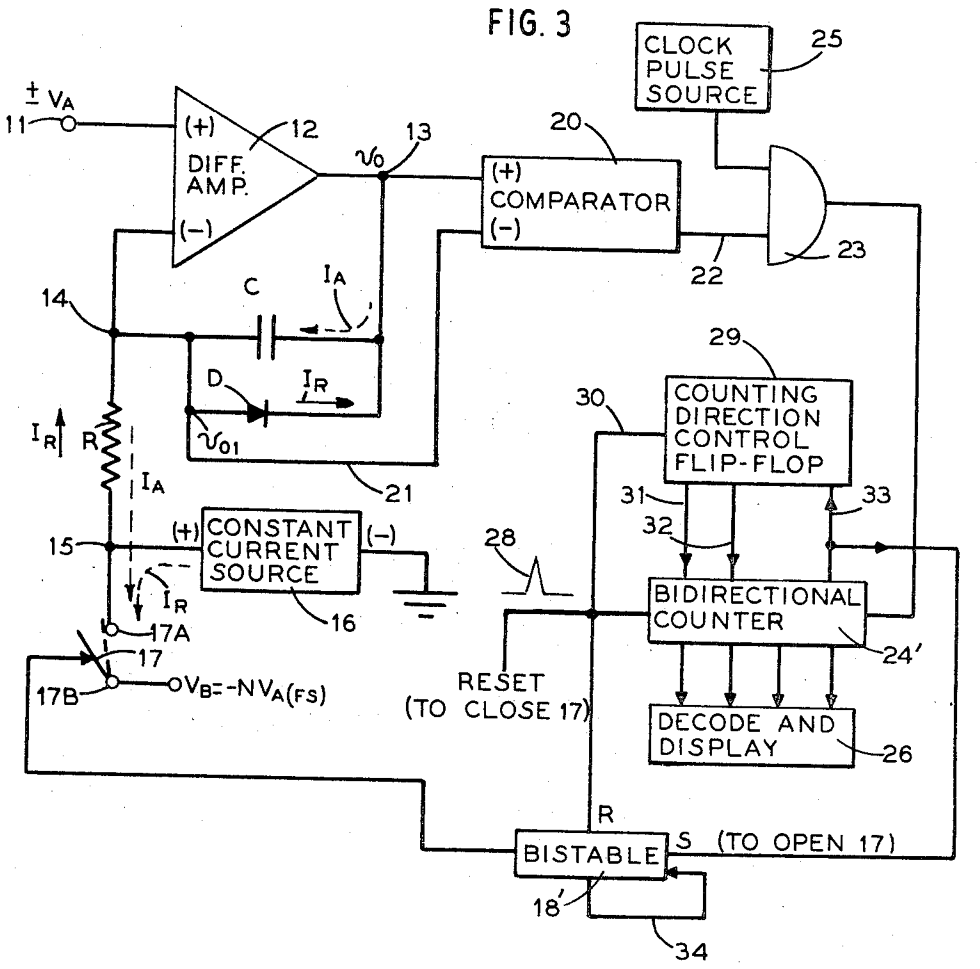
FIG. 3 illustrates partially in block and partially in schematic form another embodiment constructed in accordance with the principles of this invention for converting a bipolar analog input voltage into an equivalent time or digital representation.

FIG. 3 illustrates another embodiment of the instant invention wherein a bidirectional (up/down) counter is utilized in combination with other circuit means to effect the mutually exclusive time integrations of a bipolar input signal $\pm V_A$ and the reference current $I_R$. In this embodiment the constant potential source $V_B$ has an absolute magnitude $N$ times that of the full scale magnitude of the analog voltage, $V_{A(FS)}$, where $N$ is a number greater than unity, for example, 1.1, 1.5 or 2.0. For any given system $V_B$ has only one polarity and is made negative if the current source 16 is poled as illustrated in this Figure. Hence $V_B$ may be equated to $V_{A(FS)}$ by the equation $V_B = -NV_{A(FS)}$.

In this embodiment the aforedescribed bistable 18 is modified in a manner described subsequently and accordingly is designated 18' in FIG. 3, and the aforedescribed unidirectional counter 24 is replaced by a bidirectional counter, designated 24'. The counter 24' is a conventional type of pulse counter which counts up or down initially upon receiving clock pulses from the source 25 starting at some predetermined count to which the counter is reset initially. The direction of counting depends upon which of two counting directions control lines is conditioned by a voltage applied thereto.

The counting direction of the counter 24' is controlled by J–K flip-flop 29 having a reset terminal connected by a conductor 30 to receive the reset pulse 28 and two output terminals connected to a different one of two counting direction control lines 31 and 32 to apply a counting direction conditioning voltage to one line or the other depending upon the state of the flip-flop 29. A conditioning voltage on the line 31 enables the counter 24' to count up, whereas a conditioning voltage on the line 32 enables the counter 24' to count down. When reset by a pulse 28, the flip-flop 29 produces a conditioning voltage on the count up line 31 enabling the counter 24' to count up from the number to which the counter was reset. Another terminal of the flip-flop 29 is connected by a conductor 33 to a selected point in the counting chain circuitry which receives a voltage pulse when the counter registers a predetermined count, typically a full house count.

To facilitate an understanding of this embodiment it will be assumed that $V_{A(FS)}$ is to be represented by 1,000 pulse counts, that the counter 24' is a plural decade binary coded decimal counter having a unidirectional count capacity of 2,000 pulse counts, and registers all binary 0's (0000) when reset. With the switch 17 closed, the voltage $V_B$ appears as a constant or offset signal to the integrator during the first interval of integration. To fully compensate the system for this offset and thereby prevent $V_B$ from constituting part of the digitized representation of $V_A$, the absolute magnitude of $V_B$ is selected to be equivalent in count value to the unidirectional count capacity of the counter starting from reset. Thus, on the basis of the above assumption, the magnitude of $V_B$ is made equal to $2V_{A(FS)}$ and it follows that the value of $N$ in the general equation above is:

$$N = V_B/V_{A(FS)} = 2000/1000 = 2$$

After being reset, the counter 24' remains passive until the gate 23 controlling the transmission of clock pulses to the counter is enabled by the comparator 20. When this occurs, the counter 24' counts up 2,000 pulses and then produces a pulse (or carry signal) on conductor 33 which triggers the flip-flop 29 into a state for enabling the count down line 32. The pulse on conductor 33, occurring a fixed time interval after the counter 24' begins counting clock pulses, is also transmitted to the S input of the bistable 18' triggering this bistable to change state and open the switch 17. The bistable 18' differs from the bistable 18 in that signal is fed back by means of a conductor 34 connected between the bistable output and the S input thereof. This feedback signal renders the bistable unresponsible to further pulses from the counter 24' until the bistable is again reset by a subsequent pulse 28.

During the first part of each conversion cycle while the switch 17 is closed, the voltage across the capacitor C is definable by equation (1), above rewritten in the following form:

$$(v_0 - V_A) = \frac{1}{C}\int_{t_0}^{t_f}\left(\frac{V_A - V_B}{R}\right)dt$$

Figure 4:
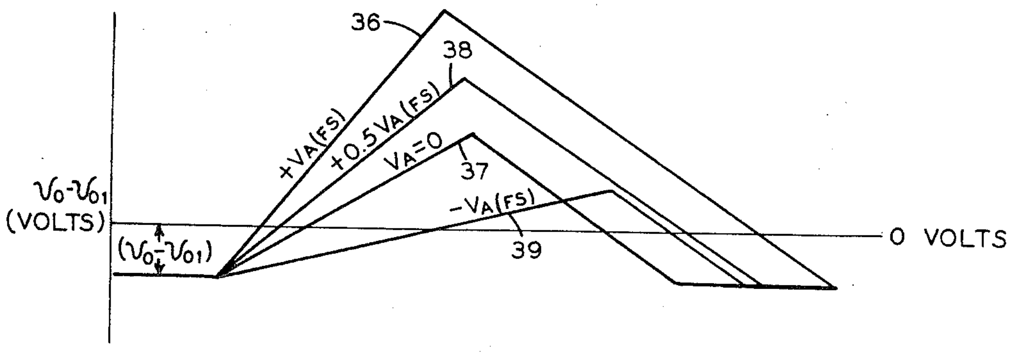
FIG. 4 depicts representative dual-slope waveforms generated by the signal integrating arrangement illustrated by FIG. 3.

Designating the voltage at the anode of the diode D as $v_{01}$, it will be evident that the quantity $V_A$ in the above equation may be replaced by the quantity $v_{01}$. FIG. 4 reflects this change in nomenclature. Thus, $$(v_0 - v_{01}) = \frac{1}{C}\int_{t_0}^{t_f}\left(\frac{V_A - V_B}{R}\right)dt \qquad (7)$$

$$= \frac{1}{RC}\int_{t_0}^{t_f}(V_A - V_B)dt \qquad (8)$$

By making the voltage magnitude of the offset voltage $V_B = -NV_{A(FS)}$ equation (8) may be written as, $$(v_0 - v_{01}) = \frac{1}{RC}\int_{t_0}^{t_f}(V_A + NV_{A(FS)})dt \qquad (9)$$

With $N$ assumed equal to 2, equation (9) becomes, $$(v_0 - v_{01}) = \frac{1}{RC}\int_{t_0}^{t_f}(V_A + 2V_{A(FS)})dt$$

and solving yields:

$$(v_0 - v_{01}) = 1/RC\,[V_A T_F + 2V_{A(FS)} T_F] \qquad (10)$$

where $T_F = (t_f - t_o)$.

For negative values of $V_A$, equation (10) takes the form:

$$(v_0 - v_{01}) = 1/RC\,[-V_A T_F + 2V_{A(FS)} T_F] \qquad (10A)$$

As a comparison of equations (10) and (10A) will bear out, at the end of the $T_F$ interval and with $N$ greater than unity, the voltage across the capacitor $C$ is composed of two voltage components; one component attributable to the voltage $V_B$ of absolute magnitude greater than that of full scale $V_A$, and a second component attributable to the analog input voltage $V_A$ that either adds to or substracts from the $V_B$ component depending upon the polarity of $V_A$. For ease of comparison, the following table lists the different possible values of $(v_0 - v_{01})$ during the $T_X$ interval of the conversion cycle opposite corresponding values of $V_A$.

TABLE

| Polarity and Magnitude of Input $V_A$ (*FS*=full scale) | $(v_0 - v_{01})$ |
|---|---|
| + *FS* | (1/RC) $[3V_{A(FS)}T_F]$ |
| +0.5 *FS* | (1/RC) $[2.5V_{A(FS)}T_F$ |
| 0 | (1/RC) $[2V_{A(FS)}T_F]$ |
| −0.5 *FS* | (1/RC) $[1.5V_{A(FS)}T_F]$ |
| − *FS* | (1/RC) $[1V_{A(FS)}T_F]$ |

Since the voltage component attributable to $V_{A(FS)}$ is of constant magnitude it may be treated as a constant in the system and yet effectively eliminated from the digitized representation of $V_A$ magnitude by allowing the counter 24' to count up to a full house count corresponding to $2V_{A(FS)}$ or to 2,000 counts and counting down from that count value as the reference current $I_R$ discharges the comparator $C$ during the $T_X$ interval.

During the interval $T_x$ the switch $S_1$ is open disconnecting $V_B$ from the integrating circuit input. Accordingly, the equation defining the voltage $v_o$ during this interval is:

$$v_0 = V_A + \frac{1}{C}\int_{t_f}^{t_x} I_R dt \qquad (11)$$

By substituting $v_{01}$ for $V_A$ and rewriting, equation (11) becomes:

$$(v_0 - v_{01}) = \frac{1}{C}\int_{t_f}^{t_x} I_R dt$$

and solving yields:

$$(v_0 - v_{01}) = 1/C\,[I_R T_x] \qquad (12)$$

where $T_x = (t_x - t_f)$. It will be evident that equation (12) is the same as equation (3) of the previous embodiments.

Equating equations (10) and (12) yields the following expression for $T_x$ for various values of $V_A$;

$$T_x = V_A T_F FRR + V_{A(FS)} R_F / I_R R \quad (13)$$

Constant values accorded each term of the quantity $T_F/I_R$ are determined by the particular time-voltage relationship desired between $T_x$ and $V_A$. Therefore, this quantity may be regarded as a constant scaling factor, $K$, having typical values of either 1, 10, or 100 in instances where a plural stage decade counter is employed as the pulse counting means in the converter. Accordingly, equation (13) may be rewritten in the form $T_X = V_A K + V_{A(FS)} K$; where $V_A$ may be a positive or negative quantity. Moreover, and as mentioned hereinabove, the quantity $V_{A(FS)}$ is also a constant and may be completely removed from the digital representation of input $V_A$ by permitting the counter 24' to begin counting down from $NV_{A(FS)}$ in decreasing numerical sequence so that with $V_A = 0$ the counter 24' provides a zero (0000) output and for other magnitudes of $V_A$ the counter provides digital representation of that magnitude exclusive of any offset $V_B$. Thus, direct proportionality is achieved between the independent variable $T_X$ and the dependent variable $\pm V_A$ as required by equation (13).

In the equation $V_B = NV_{A(FS)}$, $N$ can also have a value of unity so long as $V_B$ does not equal minus $V_A$ because in such case there will be equal voltages at opposite ends of the resistor $R$ and no net current flow therethrough. Hence, the capacitor $C$ could not be charged during the interval $T_F$ under these conditions.

DESCRIPTION OF OPERATION OF FIG. 3 EMBODIMENT

Summarizing briefly the operation of the embodiment illustrated by FIG. 3, a conversion cycle is initiated by the generation of the reset pulse 28 which resets the counter 24' to zero, resets the flip-flop 29 enabling the count up line 31 in the counting chain, and resets the bistable 18' which in turn closes the switch $S_1$. The capacitor $C$ is then charged by an analog current.

$$I_A = [V_A - (-2V_{A(FS)})]/R = V_A + 2V_{A(FS)})/R$$

When the difference in voltage $(v_0 - v_{01})$ across the capacitor $C$ equals zero, the comparator 20 changes state, enables the gate 23 and permits clock pulses to flow from the source 25 to the counter 24'. When 2,000 clock pulses are counted, an output pulse is generated by the counter 24' and transmitted via the conductor 33 to set the bistable 18'. The switch $S_1$ is opened by the bistable 18' changing state allowing reference current $I_R$ to discharge the capacitor $C$. With feedback applied through the loop 34 the bistable 18' latches up and remains unaffected by any subsequent output pulse on conductor 33 until it is reset once again. As will be apparent subsequently, such a pulse will be generated by the counter 24' recycling to provide the digital representation of positive magnitudes of $V_A$.

This pulse on the conductor 33 is also used to toggle the flip-flop 29 which changes state to condition the count down line 32. As the reference current $I_R$ discharges the capacitor $C$, the counter 24' counts down from 2,000 toward zero in accordance with the polarity and magnitude of $V_A$.

If $V_A$ is negative relative to ground potential the threshold $(v_O - v_{01}) = 0$ will be reached before the counter 24' registers a zero count and the count in the counter provides a direct numerical representation of the magnitude of $V_A$.

If $V_A$ is zero volts the threshold voltage for triggering the comparator 20 will be reached when the counter 24' registers a count of 0000.

If $V_A$ is positive the counter 24' will count down to zero then produce an output pulse on conductor 33 then toggles the flip-flop 29 to again condition the count up line 31. Further pulses will appear as a count up in the counter 24'. For reasons disclosed hereinabove, the state of the bistable 18' is made unresponsive to this pulse on conductor 33. When the threshold condition of $(v_O - v_{01}) = 0$ is attained the count registered by the counter 24' is again directly proportional to the magnitude of $+V_A$.

For any of the three above listed cases when threshold is crossed, the comparator 20 will change state and disable the gate 23 to terminate pulse counting. The system will now remain in a passive state until another reset pulse 28 is generated to commence another conversion cycle.

In FIG. 4, numeral 36 designates the dual ramp waveform produced by the instant embodiment when the analog input voltage $V_A$ has a positive full scale magnitude, numeral 37 designates the waveform produced when this voltage is zero, numeral 38 designates the waveform produced when this voltage is one-half full scale, and numeral 39 designates the waveform produced when this voltage has a negative full scale magnitude. In each waveform the slope of the first ramp is dependent upon the magnitudes of the voltages $V_A$ and $V_B$ and the slope of the second ramp is dependent upon the magnitude of the reference current $I_R$ and is independent of $V_A$ and $V_B$.

If $V_B$ is made positive, the polarity of the source 16 must be reversed from that depicted in FIG. 3. Under these conditions, the ramps 36 and 38, FIG. 4, would correspond to $-V_{A(FS)}$ and $-0.5V_{A(FS)}$, respectively, whereas the ramp 39 would correspond to $+V_{A(FS)}$.

It will be apparent that although only a simple input or analog switch 17 is employed in combination with the instant integrating circuit, the slope of the second ramp generated during the variable interval $T_X$, while a direct function of the reference current magnitude, is not a function of the analog signal magnitude.

As will be appreciated by those working in the analog-to-digital converter art, this invention makes possible the precise conversion of either a monopolar or bipolar analog signal within the time frame of a single conversion cycle, without sacrificing any of the well known advantages attributable to dual-slope integration.

What is claimed is:

1. An analog-to-digital conversion system for producing a digital representation of the magnitude of an analog input signal of unknown magnitude comprising:

a differential amplifier having inverting input, non-inverting input and output terminals, means for applying an analog signal to the non-inverting input terminal continuously during an analog-to-digital conversion cycle comprising first and second successive time intervals, reactive feedback means coupling said output terminal to said inverting terminal whereby the voltage at said inverting terminal is at all times linearly related and substantially equal to, the analog signal, a source of electrical current of constant magnitude, electrical resistance means connecting the current source to said inverting input terminal and with said reactive means comprising integrating means, switch means for selectively connecting the current source end of said resistance means to a source of fixed potential having a magnitude referenced to the full scale magnitude of the analog signal, whereby one current proportional to the potential at said non-inverting input terminal flows through said resistance means in a first direction during the first time interval when said switch means connects said potential source to said current source, said first time interval including a variable time interval and a fixed time interval, the variable time interval being a function of the analog signal magnitude and preceding the fixed time interval, said current source having a polarity such that current therefrom flows through said resistance means in a second direction opposite said first direction during the second time interval when said switch means disconnects said potential source from said current source, means including digital timing means for fixing the time duration of said fixed time interval coupled to said switch means for time controlling the state thereof such that said one current flows through said resistance means in said first direction for said fixed first time interval followed by current flow from said current source through said resistance means in said second direction, and means coupled to said output terminal of said differential amplifier and to said timing means for causing said timing means to also digitally time the current flow in said second direction to provide a digital representation of the analog signal magnitude.

2. The system according to claim 1 wherein said source of fixed potential is ground.

3. The system according to claim 1 wherein the absolute magnitude of said source of fixed potential is greater than the full scale voltage magnitude of the analog signal.

4. The system according to claim 3 wherein said source of fixed potential has a polarity determined by the polarity of the full scale analog signal.

5. The system according to claim 4 wherein the polarity of said source of fixed potential is the same as that of the full scale analog voltage.

6. The system according to claim 4 wherein the polarity of the source of fixed potential is opposite that of the full scale analog voltage.

7. The system according to claim 1 wherein said switch means has open and closed states and which further comprises, a junction common to one end of said switch means, said source of electrical current and said electrical resistance means; the value of said electrical resistance means being substantially greater than the resistance of the electrical circuit created between said junction and said source of fixed potential upon closure of said switch means.

8. The system according to claim 7 wherein the analog signal has a predetermined full scale voltage magnitude $V_{A(FS)}$, and wherein the relation between said voltage and the voltage $V_B$ produced by said source of fixed potential is, $V_B = NV_{A(FS)}$; where $N$ is a constant.

9. The system according to claim 8 wherein the fixed potential source has a low impedance and $N$ is substantially equal to zero and wherein said source of electrical current and said switch means has one terminal thereof commonly coupled to said junction, whereby closure of said switch means shunts the source of electrical current to said fixed potential source.

10. The system according to claim 1 wherein comprises, means for clamping the potential at said differential amplifier output at essentially one level prior to closure of said switch means and to said first time interval, and voltage comparison means coupled to said differential amplifier output terminal and to said differential amplifier inverting input terminal and producing an output signal in response to the potential at said differential amplifier output at least equalling that at said inverting input terminal upon closure of said switch means, said comparison means thereby establishing a threshold level different from that of said one level and about which threshold level said differential amplifier output potential departs and returns in said fixed and second time intervals, respectively.

11. The system according to claim 10 wherein said timing means comprises, pulse counting means coupled to said voltage comparison means and responsive to the output signal thereof for initiating the timing of said first time interval.

12. The system according to claim 11 wherein said pulse counting means comprises a plurality of counting stages, and means coupling a selected one of said counting stages to said switch means and means responsive to a counting transition in the one stage for driving said switch means to the open state.

13. The converter according to claim 12 wherein said means responsive to said counting transition comprises, a bistable device and which further comprises, means for resetting said pulse counter to a predetermined starting count and said bistable device at least prior to said first time interval, said bistable device when reset driving said switching device to the closed state.

* * * * *